United States Patent [19]

Nakagawa et al.

[11] Patent Number: 5,249,906
[45] Date of Patent: Oct. 5, 1993

[54] PRESS MACHINE FOR CHIP TYPE ELECTRONIC COMPONENTS

[75] Inventors: Tadahiro Nakagawa; Shizuma Tazuke; Satoshi Omuro; Kiyoshi Yoshida; Nobuaki Kashiwagi; Takashi Kimoto; Naoyuki Mori; Hidemasa Iwami; Shigeo Hayashi; Nobuyuki Hayashi; Toru Matsumura, all of Kyoto, Japan

[73] Assignee: Murata Manufacturing Co., Ltd., Japan

[21] Appl. No.: 848,244

[22] Filed: Mar. 9, 1992

[30] Foreign Application Priority Data

Nov. 8, 1991 [JP] Japan ................. 3-321332
Nov. 8, 1991 [JP] Japan ................. 3-321333
Dec. 3, 1991 [JP] Japan ................. 3-347939

[51] Int. Cl.⁵ ............................... B65G 65/00
[52] U.S. Cl. ............................ 414/417; 100/237; 414/404
[58] Field of Search ............ 414/403, 404, 417; 29/739; 100/218, 226, 237

[56] References Cited

U.S. PATENT DOCUMENTS

| 4,124,352 | 11/1978 | Pasch | 414/417 X |
| 4,388,035 | 6/1983 | Cayton et al. | 414/417 |
| 4,393,808 | 7/1983 | Braden | 414/417 X |
| 4,395,184 | 7/1983 | Braden | 414/417 |
| 4,553,322 | 11/1985 | Cappos et al. | 29/739 |
| 4,664,943 | 5/1987 | Nitta et al. | 427/58 |
| 4,763,400 | 8/1988 | Deckers | 239/739 X |
| 4,788,931 | 12/1988 | Nitta et al. | 118/503 |
| 4,891,879 | 1/1990 | De Lange | 29/822 |
| 4,915,565 | 4/1990 | Bond et al. | 414/417 X |

FOREIGN PATENT DOCUMENTS

| 0157451 | 10/1985 | European Pat. Off. | 29/739 |
| 0230870 | 8/1987 | European Pat. Off. | |
| 297895 | 11/1989 | Japan | 29/739 |
| 197197 | 8/1990 | Japan | 29/739 |
| 110895 | 5/1991 | Japan | 29/739 |
| 3-44404 | 7/1991 | Japan | |
| 2140716 | 12/1984 | United Kingdom | |

*Primary Examiner*—David A. Bucci
*Attorney, Agent, or Firm*—Ostrolenk, Faber, Gerb & Soffen

[57] ABSTRACT

Pin head mounting members are rotatably mounted on a horizontal spindle above a table which horizontally supports a holding, plate holding chip type electronic components. The spindle is vertically movable by a vertical cylinder. Each pin head mounting member is shaped as a rectangular sleeve. A mounting surface is formed on each side portion of the pin head mounting member. A pin head each having a number of press pin is detachably mounted on each of the mounting surfaces A locking pin is provided on an upper end portion of the spindle for locking the pin head mounting members every 90°. Thus, it is possible to efficiently replace press pins in response to a type change of chip type electronic components, as well as to quickly exchange a broken press pin.

9 Claims, 6 Drawing Sheets

PRESS MACHINE FOR CHIP TYPE ELECTRONIC COMPONENTS

BACKGROUND OF THE INVENTION

1. Field of the Invention

The present invention relates to a press machine for carrying out at least one operation on chip-type electronic components which may be for example, inserting chip type electronic components such as chip capacitors or chip resistors into receiving holes of a holding plate, transferring chip type electronic components from a holding plate holding the chip type electronic components to another holding plate, or pressing out chip type electronic components from receiving holes of a holding plate.

2. Description, of the Background Art

A holding plate elastically holding a number of chip type electronic components is employed for simultaneously applying electrodes onto end portions of the chip type electronic components, as described in U.S. Pat. No. 4,395,184. This holding plate comprises a hard substrate; a thin flat plate portion formed at a central portion of the hard substrate and provided with a number of through holes; and a rubber-like elastic member which is embedded in a concave portion defined in the flat portion and provided with receiving holes which pass through the elastic member, in members corresponding to the through holes. This holding plate is adapted to form external electrodes on both ends of chip type electronic components in the following manner:

First, a guide plate, which is provided with a plurality of through holes in correspondence to the receiving holes of the holding plate, is arranged on the surface of the holding plate. Then chip type electronic components are inserted one by one into the through holes of the guide plate and downwardly pressed by press pins, and are thereby received in the receiving holes, so that the holding plate elastically holds the chip type electronic components to expose upper end portions thereof on its surface. The holding plate thus holding the chip type electronic components is then turned over and the downwardly exposed portions of the chip type electronic components are pressed against an electrode coating plate which is coated with electrode paste of silver or the like, so that electrodes are applied to the end portions of the chip type electronic components. After the electrodes are dried, a second holding plate is arranged under the first holding plate holding the chip type electronic components, on the other side of a frame type spacer of a prescribed thickness. Then the chip type electronic components are transferred from the first holding plate to the second one by press pins which are similar to those mentioned above, so that other end portions, provided with no electrodes, of the chip type electronic components are exposed. Thereafter electrode paste is applied to the other end portions of the chip type electronic components by an operation similar to the above, and then dried. Thus, electrodes are formed on both end portions of the chip type electronic components as disclosed in U.S. Pat. No. 4,664,943.

In order to insert the chip type electronic components from the guide plate into the holding plate or transfer the same from a holding plate to another one, a press machine having a number of press pins is employed. U.S. Pat. No. 4,395,184 discloses an example of such a press machine. This press machine comprises an upper plate which is vertically moved by a handle, and a number of press pins which are downwardly projected from the upper plate. A mechanism for positioning a guide plate, a holding plate and a discharge plate in an overlapping state is provided under the upper plate.

A holding plate is adapted to form electrodes on chip type electronic components of various sizes in a range of 1.6 mm in length, 0.8 mm in width and 0.8 mm in thickness to 5.7 mm in length, 5.0 mm in width and 2.0 mm in thickness, for example. In order to insert or transfer chip type electronic components of different sizes into or from the receiving holes of the holding plate, therefore, it is necessary to use press pins of different diameters. However, such press pins are generally integrated with the press machine, and hence it is necessary to prepare a plurality of press machines in response to the chip type electronic components of various sizes, with disadvantageous increase in cost.

Further, press pins are made of a hard metal such as hardened steel, and those of about 0.5 mm in diameter may be broken when they are used a little less than ten thousand times. While a single press machine is generally provided with about 2000 to 3000 press pins, the machine cannot be used if only one of the pins is broken. In this case, it is necessary to disassemble the entire press machine in order to exchange the broken press pin with a new one. Thus, the time to exchange the broken press pin while stopping the press machine is increased, leading to inferior productivity.

SUMMARY OF THE INVENTION

Accordingly, an object of the present invention is to provide a press machine in which press pins can efficiently be replaced in response to the type of chip type electronic components being handled, and in which it is possible to quickly exchange a broken press pin.

In order to attain the aforementioned object, the press machine according to the present invention comprises a table for horizontally supporting a holding plate in a home position, a pin head mounting member which is arranged above the table and supported to be rotatable about a horizontal axis, vertical means for vertically moving the pin head mounting member, a pin head detachably mounted on the outer periphery of the pin head mounting member, having a plurality of press pins corresponding to receiving holes of the holding plate, and locking means for regulating the rotation of the pin head mounting member in a prescribed position including a position for downwardly directing a surface of the pin head and for projecting the press pins in a horizontal state.

Preferably the pin head mounting member is provided on its sides with a plurality of mounting surfaces which can be provided with pin heads in the direction of rotation, and the locking means regulates rotation of the pin head mounting member in a position for downwardly directing a surface, and projecting the press pins of the pin head mounted on each mounting surface in a horizontal state.

It is assumed that chip type electronic components are inserted into receiving holes of a holding plate, for example. In the initial state, a pin head having press pins corresponding in size to chip type electronic components is mounted on the mounting surface of the pin head mounting member, which in turn is rotated to a position for downwardly directing the surface of the pin head projecting the press pins in a horizontal state and locked in this position by the locking member. In this state, a guide plate containing the chip type electronic components are placed on the holding plate, and these plates are integrally set on the table. Then the pin head mounting member is moved downwardly by the vertical means, so that the press pins are inserted through holes of the guide plate, to press the chip type electronic components into the receiving holes of the holding plate.

According to the present invention, the pin head is detachable from the pin head mounting member. The pin head itself may be replaced in order to change the press pins, whereby the press body can be commonly applied to various sizes of chip type electronic components. In general, however, it is not easy to mount a considerably heavy pin head, which is provided with thousands of press pins, onto the lower surface of a pin head mounting member. According to the present invention, the pin head mounting member is rendered rotatable so that the pin head can be mounted at any arbitrary angle onto the upper surface of the pin head mounting member. Thus, it is possible to remarkably improve workability.

When any press pin is broken, the pin head may simply be exchanged with a new one without disassembling the press machine, whereby it is possible to reduce the exchange time, i.e., the stop time of the press machine The pin head having a broken press pin may be disassembled in another place for exchanging the broken press pin.

When a plurality of pin heads can be mounted on the pin head mounting member in the direction of rotation, the following effects are attained: if a plurality of pin heads having press pins which are different in diameter from each other are mounted on respective mounting surfaces of the pin head mounting member, it is possible to cope with a change of production plan following the type change of the chip type electronic components by simply rotating the pin head mounting member at a constant angle. If a plurality of pin heads having press pins of the same diameter are mounted on a mounting surface of the pin head mounting member, it is possible to exchange a pin head having a broken press pin by simply rotating the pin head mounting member at a constant angle. Namely, it is possible to further reduce the time for a change of production plan as well as the pin exchange time.

In addition to the aforementioned operation for inserting the chip type electronic components into the receiving holes of the holding plate, the press machine according to the present invention is also applicable to an operation for transferring chip type electronic components from a holding plate holding the same to another holding plate, and an operation for pressing out chip type electronic components from receiving holes of a holding plate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
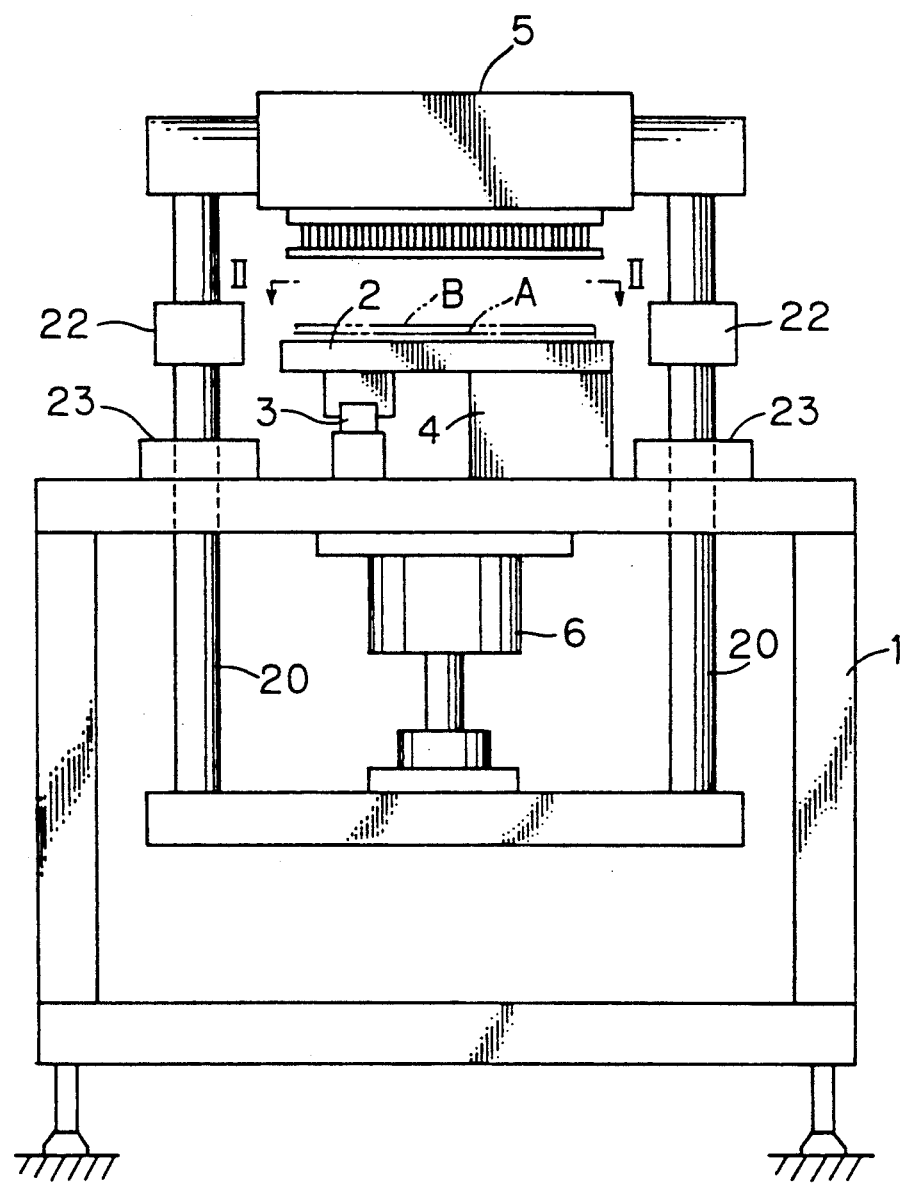
FIG. 1 is a front elevational view schematically showing a press machine according to an embodiment of the present invention.

FIG. 1 shows an embodiment of a press machine according to the present invention, which cam be applied to an operation for inserting chip type electronic components C into receiving holes $a_1$ of a holding plate A, and an operation for transferring chip type electronic components from a holding plate holding the same to another holding plate, or the like. The holding plate A is similar in structure to that disclosed in Japanese Patent Publication No. 3-44404 (1991).

The inventive press machine comprises a press body 1 which is set in a horizontal position, a table 2 which is horizontally movably supported on the body 1 through a guide rail 3 and a uniaxial unit 4, a press head portion 5 which is vertically movably supported with respect to the body 1, and a vertical cylinder 6, serving as a press machine driving portion, for vertically driving the press head portion 5.

Figure 2:
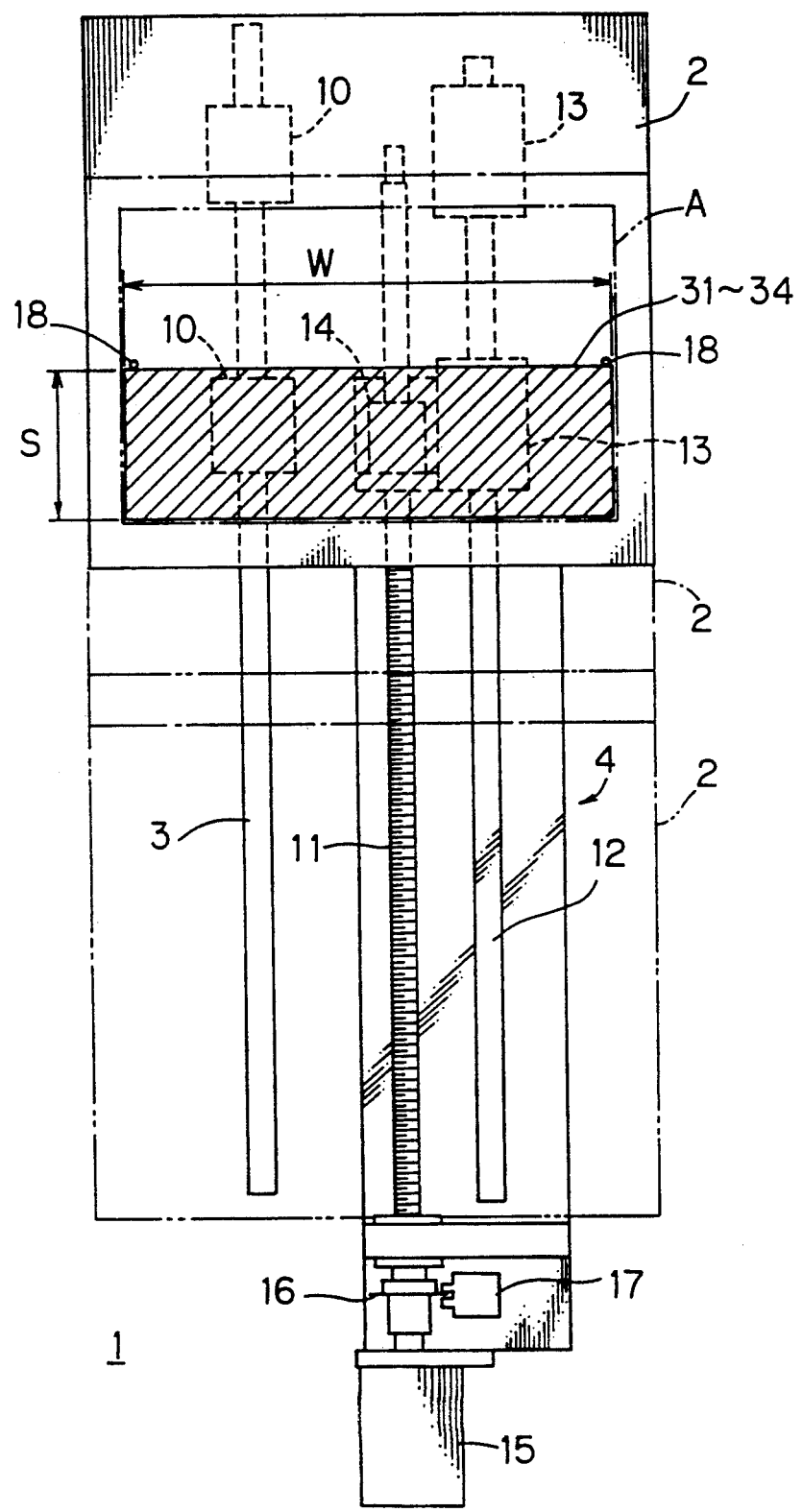
FIG. 2 is an enlarged view as viewed along the line II—II in FIG. 1.

FIG. 2 shows a mechanism for moving the table 2. The guide rail 3 is longitudinally set on the upper surface of the body 1, and a slide bearing 10 is provided on the lower surface of the table 2 to slidably engage with the guide rail 3. The uniaxial unit 4 comprises a ball screw 11 and a guide rail 12, and a slide bearing 13 is mounted on the lower surface of the table 2 to slidably engage with the guide rail 12. A nut 14 is fixed to the slide bearing 13, to be fitted with the ball screw 11. The ball screw 11 is rotatably/driven by a stepping motor 15, which is provided on the body 1. When the stepping motor 15 is driven, it is possible to longitudinally move the table 2 while maintaining the table in a horizontal state, and the position of the table 2 can be arbitrarily set by a pulse signal which is inputted in the stepping motor 15. A detecting plate 16 is fixed to the rotary axis of the stepping motor 15, and a position detector 17 of a photointerrupter is provided in correspondence thereto. The detecting plate 16 and the position detector 17 are adapted to confirm an initial position of the table 2 in an auxiliary manner.

The table 2 can be stopped at a set position shown by the double dotted chain lines and the two working positions shown by single-dot chain lines and solid lines in FIG. 2. The two working positions are provided for pressing a single holding plate A twice, for the reason described below.

A pair of set pins 18 are provided on both sides of the upper surface of the table 2 to engage in set holes $a_2$ (see FIG. 5) which are formed on both side portions of the holding plate A, thereby setting the holding plate A in a constant position on the table 2. In operation, the table 2 is brought into the set position for receiving the holding plate A thereon, and then retracted to the working positions for the prescribed pressing operations. Thereafter the table 2 is again brought into the set position, for discharging the holding plate A.

Figure 3:
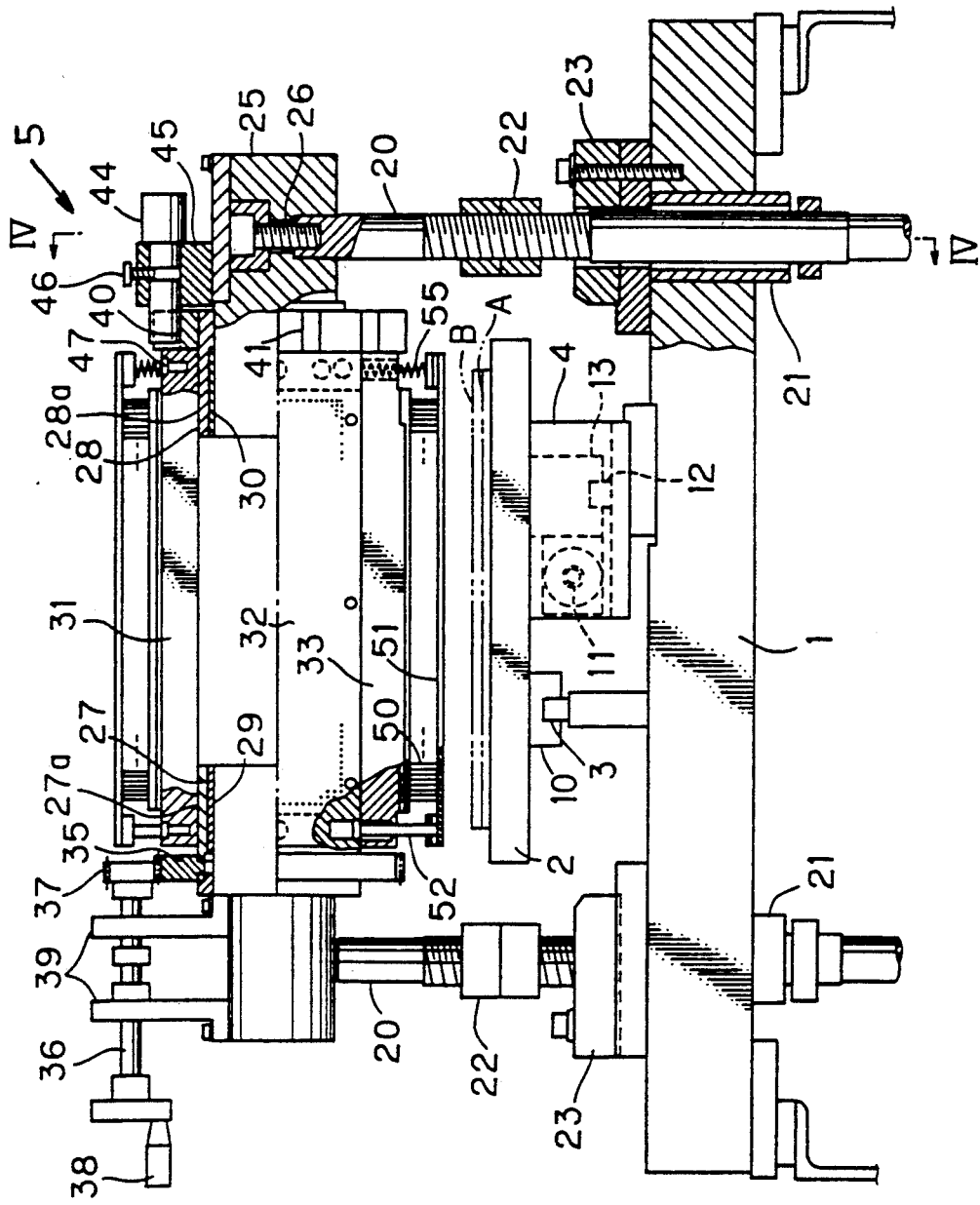
FIG. 3 illustrates an upper portion of the press machine in detail.
Figure 4:
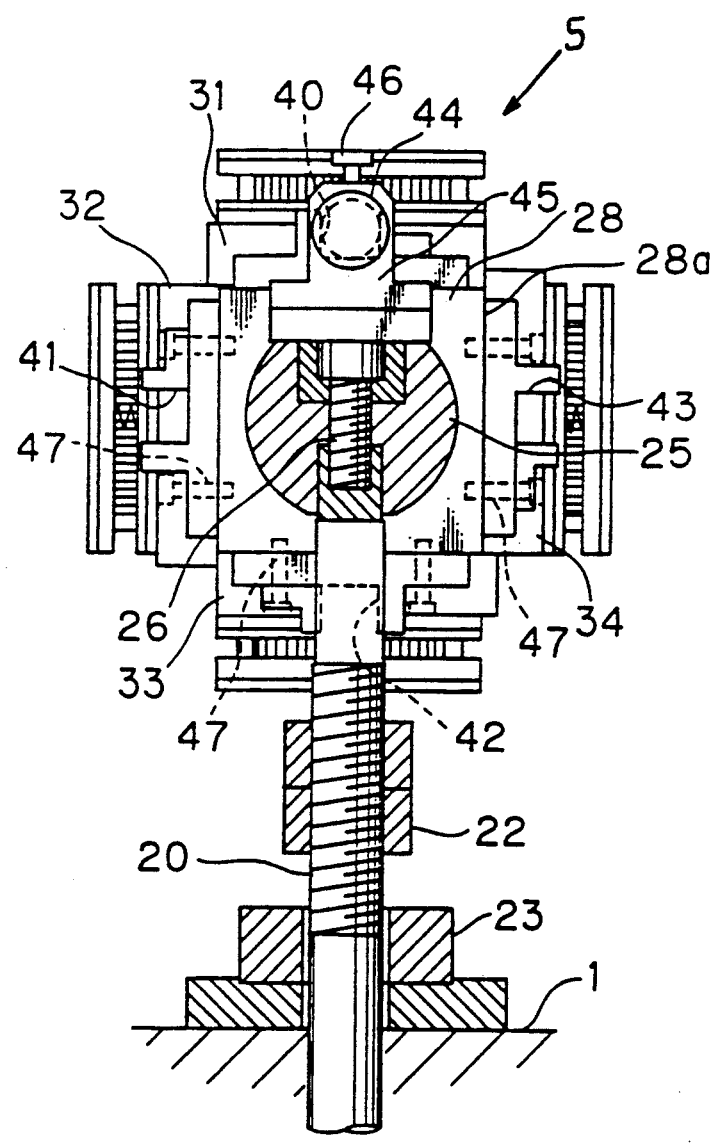
FIG. 4 is a cross-sectional view taken along the line IV—IV in FIG. 3.

FIGS. 3 and 4 illustrate the press head portion 5 in detail. A pair of vertical shafts 20 are vertically movably supported on both sides of the working positions of the press body 1 through slide bearings 21. Lower ends of the vertical shafts 20 are coupled to a rod of the vertical cylinder 6, serving as a press machine driving portion, which is driven for vertically moving the vertical shafts 20. Nuts 22 are fitted with intermediate portions of the vertical shafts 20, and stoppers 23 for setting lower limit positions are detachably mounted on the upper surface of the body 1 for position-controlling the lower surfaces of the nuts 22.

A spindle 25 is fixed by bolts 26 to the upper ends of the vertical shafts 20 in a horizontally extending state. Spindle 25 is formed by a stepped shaft having a central portion of maximum diameter, inbetween portions of an intermediate diameter, and two end portions of a minimum diameter A pair of pin head mounting members 27 and 28 are rotatably mounted on the in-between portions by bearings 29 and 30. Each of the pin head mounting members 27 and 28 is in the form of a rectangular sleeve having four mounting surfaces 27a or 28a on its periphery. Pin heads 31 to 34 are detachably mounted on the mounting surfaces 27a and 28a of the pin head mounting members 27 and 28 by bolts 47 to extend across the mounting surfaces 27a and 28a.

A gear 35 is fixed to an end of the first pin head mounting member 27, to be fitted with a pinion 37 which is fixed to an end of an operation shaft 36. A handle 38 is mounted on the other end of the operation shaft 36, which is rotatably supported by a pair of brackets 39 fixed to an end upper surface of the spindle 25. The handle 38 is driven to rotate the pin head mounting member 27 through the pinion 37 and the gear 35, thereby integrally rotating the four pin heads 31 to 34 which are mounted on the pin head mounting member 27.

The rotatable second pin head mounting member 28 is provided on its four mounting surfaces 28a with locking grooves 40 to 43. A locking pin 44 can be inserted in any one of these locking grooves 40 to 43 for positioning the pin heads 31 to 34 at intervals of 90°. In other words, it is possible to lock one of the pin heads 31 to 34 in a downwardly directed horizontal state facing the table 2. The locking pin 44 is reciprocably inserted in a support member 45 which is fixed to the other end upper surface of the spindle 25, to be fixed in a position engaging with one of the locking grooves 40 to 43 by a set screw 46 mounted on the upper surface of the support member 45.

Figure 5:
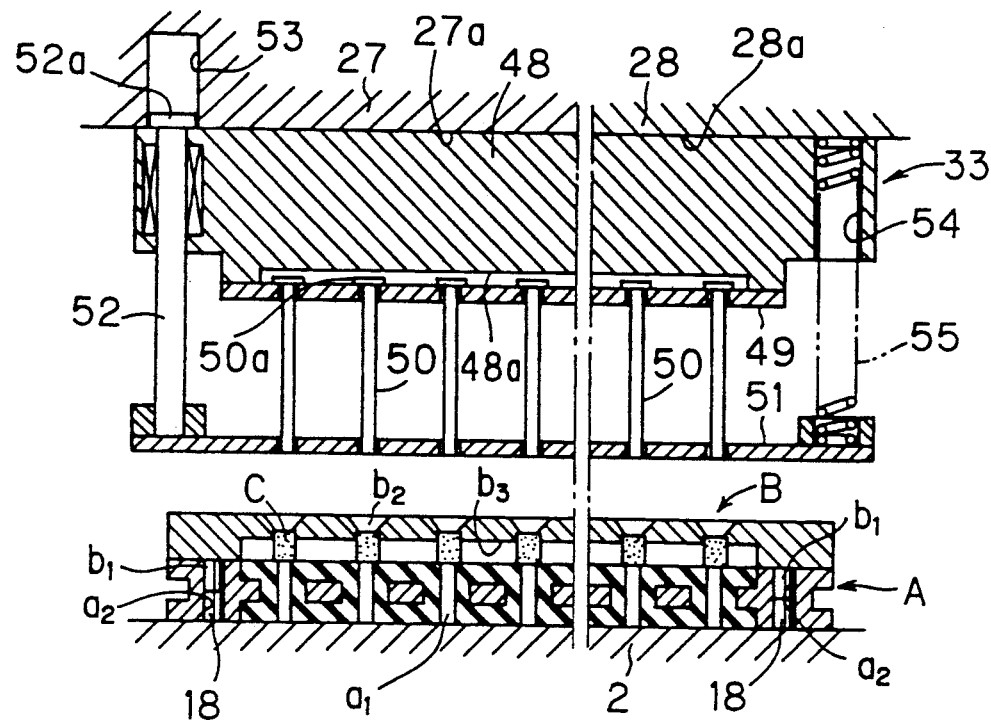
FIG. 5 is an enlarged cross-sectional view of the press machine shown in FIG. 1, which is applied to an operation for inserting chip type electronic components into receiving holes of a holding plate.

The pin heads 31 to 34 are similar in structure to each other. FIG. 5 shows the internal structure of the pin head 33. Pin head 33 comprises a backing plate 48 which is detachably mounted on the mounting surfaces 27a and 28a of the pin head mounting members 27 and 28 by bolts 47 (FIG. 4), a pin plate 49 which is fixed to the lower side of the backing plate 48, flanged press pins 50 which are slidably inserted in holes of the pin plate 49, and a stripper plate 51 for guiding forward end portions of the press pins 50. The press pins 50 are suspended from the pin plate 49 at flange portions 50a, which are moved up to positions to contact horizontal surface 48a of the backing plate 48 when a reactive press force acts on the press pins 50. The press pins 50, which are slidable with respect to the pin plate 49, can be easily extracted when the pin plate 49 is detached from the backing plate 48. Thus, the press pins 50 can be easily exchanged with new ones. Guide shafts 52 are slidably inserted in four corners of the backing plate 48, so that head portions 52a of first ends thereof are inserted in recesses 53 of the pin head mounting members 27 and 28 and second ends are fixed to the stripper plate 51. The backing plate 48 is provided on centers of both end portions thereof with spring holes 54 for receiving second ends of springs 55, whose first ends are supported by the stripper plate 51. The stripper plate 51 is downwardly urged by repulsion of the springs 55, and prevented from displacement by the head portions 52a of the guide shafts 52.

Each of the pin heads 31 to 34 is vertically movable in a position shown by slanted lines in FIG. 2. Each pin head has a width W which is equivalent to that of the holding plate A and a depth S (along the movement of table 2) which is smaller than that of the holding plate A. The reason for this is as follows: if the holding plate A holds a large number of chip type electronic components C, the pin head is exposed to an extremely strong reactive force when the same is adapted to press all the chip type electronic components C during a stroke, requiring a strong driving force. Thus, the press machine is increased in size, and it is difficult to attain accuracy. Further, an excess load is applied to the holding plate A, to crack or deform the same. Such disadvantages can be removed if the depth S of each pin head is made smaller than that of the holding plate A and the pin head or the holding plate A is moved in the direction of depth to press the chip type electronic components C a plurality of times.

According to this embodiment, the depth S of each pin head is half that of the holding plate A, while the table 2 is moved between the two working positions which are shown by single-dot chain lines and solid lines in FIG. 2, to press a half of the holding plate A in the former position and then press the remaining half in the latter position. Thus, it is possible to press holding plates A having different depths with a single pin head, so far as the holding plates A have receiving holes $a_1$ of constant pitches and widths. If it is possible to press the holding plate A by the press pins 50 twice, the depth of the holding plate A may not be an integer times that of the pin heads 31 to 34, but may be freely varied. Further, the pin heads 31 to 34 can be reduced in depth, size and weight, to be easily mounted on or detached from the pin head mounting members 27 and 28.

The operation of the inventive press machine for inserting chip type electronic components into receiving holes of a holding plate is now described with reference to FIGS. 5 and 6.

First, a holding plate A and a guide plate B are set on the table 2, which is located in the set position. At this time, the set pins 18 are inserted in set holes $a_2$ of the holding plate A to set the holding plate A in a prescribed position on the table 2, while pins $b_1$ projected from the lower surface of the guide plate B are inserted in the set holes $a_2$ of the holding plate A in an opposite manner to the set pins 18, thereby registering the guide plate B with the holding plate A. Chip type electronic components C are stored in through holes $b_2$ of the guide plate B so that the lower surfaces thereof are supported by upper surfaces of receiving holes $a_1$ provided in the holding plate A. The upper end portions of the through holes $b_2$ provided in the guide plate B are tapered while cavities $b_3$ whose depths are smaller than the lengths of the chip type electronic components C are formed in the lower surface of the guide plate B. The cavities $b_3$, which are adapted to prevent the chip type electronic components C from contacting with the guide plate B during removal thereof, are provided as needed. After the holding plate A and the guide plate B are set in the aforementioned manner, the table 2 is slid to one of the working positions, to locate the press pins 50 immediately above the through holes $b_2$ of the guide plate B as shown in FIG. 5.

Figure 6:
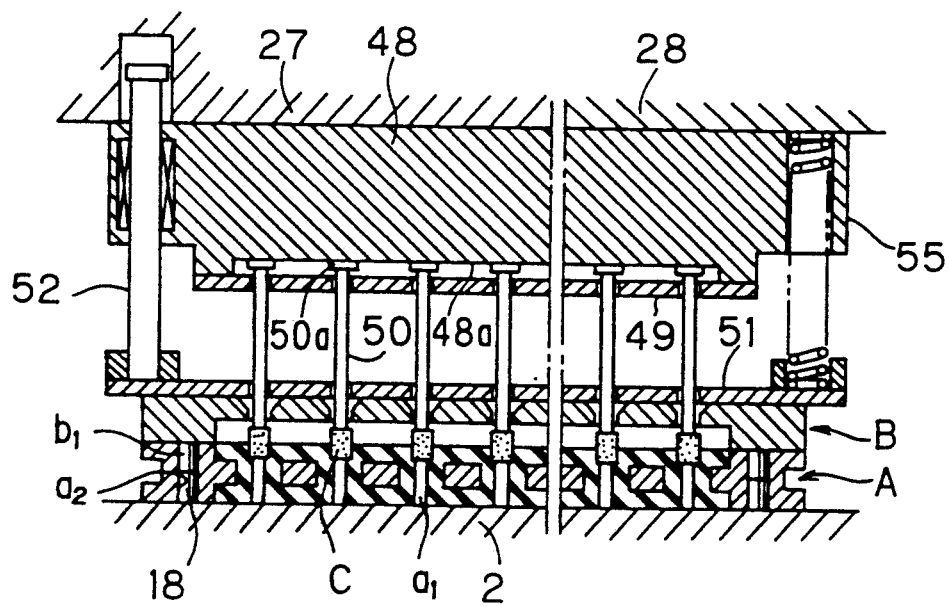
FIG. 6 is an enlarged cross-sectional view of the press machine shown in FIG. 5, which is in an intermediate stage of the operation for inserting the chip type electronic components into the receiving holes.

The vertical cylinder 6 moves the pin head 33 downward, so that the stripper plate 51 comes into pressure contact with the upper surface of the guide plate B to prevent the plates A and B from upward movement and the press pins 50 are inserted into the through holes $b_2$ of the guide plate B to press the chip type electronic components C into the receiving holes $a_1$ of the holding plate (see FIG. 6). The press pins 50 are retracted slightly when the forward ends thereof strike the chip type electronic components C, so that the flange portions 50a contact horizontal surface 48a of the backing plate 48 and the press pins 50 are thereafter pressed by the backing plate 48. When the chip type electronic components C are pressed into prescribed positions, the nuts 22 (FIGS. 3 and 4) come into contact with the stopper 23, to define the lower limit position of the pin head 33.

Then the vertical cylinder 6 moves the pin head 33 upward, so that the press pins 50 are first moved upwardly by the pin plate 49 and then the stripper plate 51 is separated from the guide plate B.

Electrode paste of silver or the like is applied to the projected portions of the chip type electronic components C which are elastically received in the receiving holes $a_1$ of the holding plate A in the aforementioned manner. The electrode paste may be applied to the chip type electronic components C with a roll as disclosed in U.S. Pat. No. 4,395,184, or with a coating plate as disclosed in U.S. Pat. No. 4,664,943.

The operation of the inventive press machine for transferring chip type electronic components from a holding plate to another holding plate is now described with reference to FIGS. 7 and 8.

Figure 7:
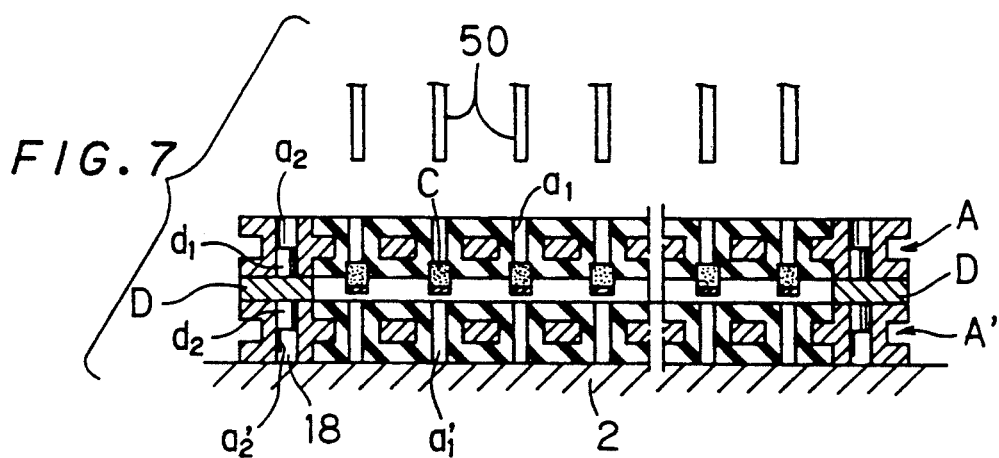
FIG. 7 is an enlarged cross-sectional view of the press machine shown in FIG. 1, which is applied to an operation for transferring chip type electronic components from a holding plate to another one.

As shown in FIG. 7, a holding plate A' holding no chip type electronic components, a frame type spacer D, and a holding plate A downwardly holding chip type electronic components C, which are provided with electrodes on first ends thereof, are set in an overlapping manner on the table 2, which is located in the set position. The spacer D is provided with pins $d_1$ and $d_2$ for engaging with holes $a_2$ and $a_2'$ of the holding plates A and A', so that the same is correctly registered with the holding plates A and A'. The holes $a_2'$ of the lower holding plate A' are made to receive the set pins 18 of the table 2, which in turn is moved to one of the working positions.

Figure 8:
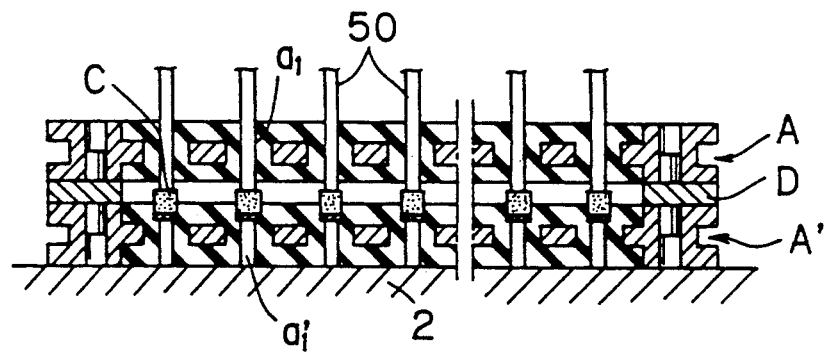
FIG. 8 is an enlarged cross-sectional view of the press machine shown in FIG. 7, which is in an intermediate stage of the operation for transferring the chip type electronic components from the holding plate to the other one.

In a similar manner as described above, the chip type electronic components C are transferred from the receiving holes $a_1$ of the upper holding plate A to the receiving holes $a_1'$ of the lower holding plate A' by the press pins 50, as shown in FIG. 8. The transferred chip type electronic components C are held by the holding plate A' to outwardly project the second ends, which are not yet provided with electrodes. Then, electrode paste is applied to the projected second ends by the prescribed method.

Figure 9:
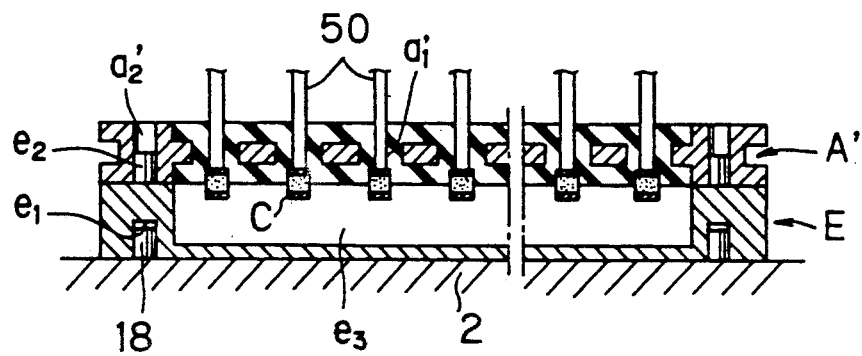
FIG. 9 is an enlarged cross-sectional view of the press machine shown in FIG. 1, which is applied to an operation for discharging chip type electronic components from a holding plate.

The operation of the inventive press machine for discharging chip type electronic components from a holding plate is now described with reference to FIG. 9.

First, a discharge plate E and a holding plate A' are set in an overlapping manner on the table 2, which is located in the set position. In this case, the set pins 18 of the table 2 are received in holes $e_1$ which are provided in the discharge plate E and pins $e_2$ projected from the upper surface of the discharge plate E are received in holes $a_2'$ which are provided in the holding plate A', whereby the discharge plate E and the holding plate A' are correctly registered in a prescribed position on the table 2. Thereafter the table 2 is moved to one of the working positions.

Similarly to the case of the inserting operation, chip type electronic components C received in receiving holes $a_1'$ of the holding plate A' are downwardly pressed by the press pins 50 into a concave portion $e_3$ of the discharge plate E. Thus, the chip type electronic components C provided with electrodes on both end portions thereof are collected in the discharge plate E.

In the aforementioned press machine, the press pins 50 may be replaced by press pins having different diameters to accommodate pressing chip type electronic components C of different sizes. To achieve this, a plurality of pin heads having press pins of different diameters are originally mounted on at least two of the four mounting surfaces of each pin head mounting member, so that an arbitrary one of the pin heads 31 to 34 is downwardly directed by rotation. At this time, the stopper 23 is replaced by that of a different thickness, in order to simultaneously change the lower limit position of the press pins 50. In order to cope with breakage of any press pin 50 upon repetition of the press operation, pin heads having press pins of the same diameter are mounted on at least two of the four mounting surfaces, so that a new pin head is downwardly directed by rotation to take place of the pin head whose press pin is broken. Thus, the pin head can be easily exchanged without stopping the press machine for an extended period of time.

The locking pin 44, which is received in one of the locking grooves 40 to 43 provided in the mounting surfaces 28a of the pin head mounting member 28, can stop the pin heads 31 to 34 every 90°, thereby downwardly arbitrarily locking one of the pin heads 31 to 34 mounted on the mounting surfaces 27a and 28a in a horizontal state. Thus, it is possible to prevent the press pins 50 from inclining during the press operation. On the other hand, the mounting surfaces 27a and 28a can be upwardly locked when the pin heads 31 to 34 are mounted on or detached from the pin head mounting members 27 and 28, whereby it is possible to easily mount the pin heads 31 to 34 even if the same are considerably heavy, reducing operation time.

The present invention is not restricted to the aforementioned embodiment. For example, the pin head mounting members 27 and 28 are not restricted to the aforementioned half-split type sleeves which are rotatably mounted on the spindle 25, but may be formed by integral type sleeves. Alternatively, the spindle 25 may be rendered rotatable to be provided with pin head mounting surfaces.

Further, the locking means may be formed by a locking pin which is driven by a solenoid, in place of the manually driven locking pin 44. Although the pin head mounting members 27 and 28 are rotated by the manually operated handle 38, the same may be rotated by an electric motor. It is possible to automate a change of production plan through a solenoid and an electric motor.

While the plate A and the plate B, the plate A and the table 2, the spacer D and the plates A and A', the discharge plate E, the table 2 and the plate A', etc. are registered with each other through engagement of pins and holes, one of the members may be provided with a working face for registering a side surface of the other member in each of such combinations.

According to the present invention, as hereinabove described, the pin head can be detached for type change or exchange of the press pins without disassembling the press machine and can be rotated with respect to the pin head mounting members at an angle for facilitating the operation, whereby it is possible to efficiently carry out a change of production plan as well as pin exchange. Further, the press body is commonly applicable to various sizes of chip type electronic components, whereby the cost can be reduced. When a plurality of pin heads can be mounted on the pin head mounting members in the direction of rotation, it is possible to cope with a change of production plan and exchange by simply rotating the pin head mounting members at a constant angle. Thus, the time for a change of production plan as well as the pin exchange time can be further reduced.

Although the present invention has been described and illustrated in detail, it is clearly understood that the same is by way of illustration with and example only and is not to be taken by way of limitation, the scope of the present invention being limited only by the terms of the appended claims.

What is claimed is:

1. A press machine for chip type electronic components for performing at least one of the following operations: inserting chip type electronic components into receiving holes of a holding plate, transferring chip type electronic components from a holding plate to receiving holes of another holding plate, and pressing out chip type electronic components from receiving holes of a holding plate, said press machine comprising:

a table for horizontally supporting a holding plate in a set position;

a pin head mounting member arranged above said table and supported to be rotatable about a horizontal axis;

vertical means for vertically moving said pin head mounting member;

at least one pin head having a plurality of press pins corresponding to the receiving holes of said holding plate, said at lest one pin head being detachably mounted on an outer periphery of said pin head mounting member; and locking means for preventing the rotation of said pin head mounting member to lock said at least one pin head mounted on said pin head mounting member in a downwardly directed position, wherein said press pins extend in a downwardly directed horizontal state to face said holding plate.

2. A press machine for chip type electronic components in accordance with claim 1, wherein the outer periphery of said pin head mounting member includes a plurality of mounting surfaces each capable of supporting said at least one pin head.

3. A press machine for chip type electronic components in accordance with claim 1, wherein said at least one pin head comprises a backing plate which is detachably mounted on said pin head mounting member and a pin plate having holes for receiving said press pins mounted with and spaced a short distance from said backing plate, each of said press pins having a flange portion and being received in one of said holes of said pinplate so that said flange portions engage and are supported by said pinplate.

4. A press machine for chip type electronic components in accordance with claim 3, wherein said at least one pin head further comprises a stripper plate vertically movable towards and away from said pin plate, said stripper plate having holes for slidably receiving said press pins.

5. A press machine for chip type electronic components in accordance with claim 1, wherein said table is horizontally movable to move said holding plate between a working position located immediately under said at least one pin head and the set position sidewardly displaced from said working position.

6. A press machine for chip type electronic components in accordance with claim 5, wherein said working position includes two positions for the pressing operation.

7. A press machine for chip type electronic components in accordance with claim 1, wherein said pin had mounting member is rotatable about a horizontally extending spindle connected to said table.

8. A press machine for chip type electronic components in accordance with claim 7, wherein said pin head mounting member comprises a rectangular sleeve having four mounting surfaces, wherein each of said four mounting surfaces is capable of supporting a pin head.

9. A press machine for chip type electronic components in accordance with claim 8, wherein said locking means comprises a locking groove disposed in each of said pin heads and a locking pin reciprocally supported by said spindle, said locking pin being capable of being inserted in one of said locking grooves, said pin head mounting member being rotatable to align said locking pin with the locking groove of the respective pin head and said locking pin being insertable into the locking groove to direct said pin head downward towards said holding plate.

* * * * *